(12) United States Patent
Shiohara

(10) Patent No.: US 10,741,238 B2
(45) Date of Patent: Aug. 11, 2020

(54) ON-VEHICLE DEVICE, CLOCK SETTING METHOD FOR ON-VEHICLE DEVICE, AND COMPUTER-READABLE NON-TRANSITORY STORAGE MEDIUM HAVING PROGRAM STORED THEREIN

(71) Applicant: TOYOTA JIDOSHA KABUSHIKI KAISHA, Toyota-shi, Aichi-ken (JP)

(72) Inventor: Kazuyoshi Shiohara, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/273,644

(22) Filed: Feb. 12, 2019

(65) Prior Publication Data

US 2019/0304531 A1 Oct. 3, 2019

(30) Foreign Application Priority Data

Apr. 2, 2018 (JP) ................................ 2018-070797

(51) Int. Cl.

| G11C 11/4076 | (2006.01) |
| G11C 7/22 | (2006.01) |
| G06F 13/16 | (2006.01) |
| H03K 3/011 | (2006.01) |
| G11C 11/406 | (2006.01) |
| H03K 3/03 | (2006.01) |

(52) U.S. Cl.

CPC .......... *G11C 11/4076* (2013.01); *G11C 7/222* (2013.01); *G06F 13/1668* (2013.01); *G11C 11/406* (2013.01); *H03K 3/011* (2013.01); *H03K 3/0315* (2013.01)

(58) Field of Classification Search

CPC ... G11C 14/0018; G11C 5/141; G11C 11/406; G11C 11/40626; G11C 2211/4061; G11C 2211/4068

USPC .................................... 365/149, 189.14, 222

See application file for complete search history.

(56) References Cited

U.S. PATENT DOCUMENTS

2018/0005687 A1 1/2018 Kawabe

FOREIGN PATENT DOCUMENTS

JP 2018-5569 A 1/2018

*Primary Examiner* — Thong Q Le
(74) *Attorney, Agent, or Firm* — Oliff PLC

(57) ABSTRACT

The on-vehicle device includes: an oscillation unit configured to output a clock signal; at least one calculation unit configured to operate on the basis of the clock signal; a temperature sensor; a load estimation unit configured to estimate a load on the calculation unit, and on the basis of the estimated load, estimate whether or not there is a possibility of temperature increase in the calculation unit; and a clock setting unit configured to set a frequency of the clock signal to be outputted from the oscillation unit, wherein the clock setting unit decreases the frequency of the clock signal, if the load estimation unit estimates that there is a possibility of temperature increase in the calculation unit, and the temperature measured by the temperature sensor is equal to or greater than a predetermined temperature.

9 Claims, 3 Drawing Sheets

ON-VEHICLE DEVICE, CLOCK SETTING METHOD FOR ON-VEHICLE DEVICE, AND COMPUTER-READABLE NON-TRANSITORY STORAGE MEDIUM HAVING PROGRAM STORED THEREIN

BACKGROUND OF THE INVENTION

Field of the Invention

The present invention relates to a device provided to a vehicle and including a calculation unit.

Description of the Background Art

For a semiconductor device such as a processor, increase in temperature is required to be suppressed for the purpose of stable operation. As one method for suppressing temperature increase, when the temperature value of the processor acquired by a temperature sensor is equal to or greater than a predetermined value, the frequency of an operation clock is decreased so as to reduce power consumption. Patent Literature 1 (Japanese Laid-Open Patent Publication No. 2018-5569) discloses a semiconductor device for controlling a clock frequency so that the temperature of a circuit unit does not exceed a predetermined upper limit value.

In an on-vehicle device, error in a temperature sensor might become great due to heat from an engine, sunlight, or the like. Therefore, there is a possibility that, even though the temperature of a calculation unit such as a processor has not actually reached the upper limit value, the temperature sensor outputs a temperature value exceeding the upper limit value, and the clock frequency is decreased accordingly, so that the processing capability is unnecessarily reduced.

SUMMARY OF THE INVENTION

The present invention has been made in view of the above problem, and an object of the present invention is to provide an on-vehicle device that is capable of suppressing unnecessary decrease of the clock frequency due to error of the temperature sensor while decreasing the clock frequency when the temperature becomes high due to a high load on the calculation unit.

In order to achieve the above object, one aspect of the present invention is an on-vehicle device including: an oscillation unit configured to output a clock signal; at least one calculation unit configured to operate on the basis of the clock signal; a temperature sensor configured to measure a temperature of the calculation unit; a load estimation unit configured to estimate a load on the calculation unit, and on the basis of the estimated load, estimate whether or not there is a possibility of temperature increase in the calculation unit; and a clock setting unit configured to set a frequency of the clock signal to be outputted from the oscillation unit, wherein the clock setting unit decreases the frequency of the clock signal, if the load estimation unit estimates that there is a possibility of temperature increase in the calculation unit, and the temperature measured by the temperature sensor is equal to or greater than a predetermined temperature.

Thus, a possibility of temperature increase is estimated on the basis of the load on the calculation unit, and if there is no possibility of temperature increase, the clock frequency is not decreased, and therefore unnecessary decrease of the clock frequency based on error of the temperature sensor can be avoided.

The calculation unit may have a function of determining that abnormality has occurred if a time required for predetermined processing is equal to or longer than a predetermined time, and the clock setting unit may set the predetermined time so that the predetermined time increases in accordance with an amount by which the frequency of the clock signal is decreased.

Thus, even if the processing time is prolonged in accordance with change of the clock frequency, as long as this is within a permissible range for each clock frequency, erroneous determination that abnormality has occurred can be prevented.

The clock setting unit may decrease the frequency of the clock signal by subtracting, from a clock frequency set at present, a value determined on the basis of at least one of the load estimated by the load estimation unit and a temperature value outputted from the temperature sensor.

Thus, it is possible to perform control according to the degree of the load on the calculation unit.

The load estimation unit may determine that there is a possibility of temperature increase in the calculation unit, if at least one of a condition that a usage rate of the calculation unit is equal to or greater than a predetermined value and a condition that a vehicle is in a predetermined traveling circumstance is satisfied at present or has been satisfied for a last predetermined period.

The condition that the vehicle is in the predetermined traveling circumstance may be that a number of processing targets of the calculation unit is equal to or greater than a predetermined number.

Thus, it is possible to appropriately estimate the load on the calculation unit and accurately determine the possibility of temperature increase.

Another aspect of the present invention is a clock setting method to be executed by a calculation unit of an on-vehicle device, the on-vehicle device including an oscillation unit configured to output a clock signal, at least one calculation unit configured to operate on the basis of the clock signal, and a temperature sensor configured to measure a temperature of the calculation unit, the clock setting method including: a step of the calculation unit functioning as a load estimation unit configured to estimate a load on the calculation unit, and on the basis of the estimated load, estimate whether or not there is a possibility of temperature increase in the calculation unit; a step of the calculation unit acquiring a temperature outputted from the temperature sensor; and a step of the calculation unit functioning as a clock setting unit configured to decrease the frequency of the clock signal, if the load estimation unit estimates that there is a possibility of temperature increase in the calculation unit, and the temperature measured by the temperature sensor is equal to or greater than a predetermined temperature.

Still another aspect of the present invention is a computer-readable non-transitory storage medium having stored therein a clock setting program to be executed by a calculation unit of an on-vehicle device, the on-vehicle device including an oscillation unit configured to output a clock signal, at least one calculation unit configured to operate on the basis of the clock signal, and a temperature sensor configured to measure a temperature of the calculation unit, the clock setting program including: a step of the calculation unit functioning as a load estimation unit configured to estimate a load on the calculation unit, and on the basis of the estimated load, estimate whether or not there is a possibility of temperature increase in the calculation unit; a step of the calculation unit acquiring a temperature outputted from the temperature sensor; and a step of the calculation unit functioning as a clock setting unit configured to decrease the frequency of the clock signal, if the load estimation unit estimates that there is a possibility of temperature increase in the calculation unit, and the temperature measured by the temperature sensor is equal to or greater than a predetermined temperature.

Thus, a possibility of temperature increase is determined on the basis of the load on the calculation unit, and if there is no possibility of temperature increase, the clock frequency is not decreased, and therefore unnecessary decrease of the clock frequency based on error of the temperature sensor can be avoided.

As described above, according to the present invention, the possibility of temperature increase is determined on the basis of the load on the calculation unit, and if there is no possibility of temperature increase, the clock frequency is not decreased. Thus, it is possible to provide an on-vehicle device capable of avoiding unnecessary decrease of the clock frequency based on error of a temperature sensor.

DESCRIPTION OF THE PREFERRED EMBODIMENTS

Outline

In an on-vehicle device according to the present invention, whether or not there is a possibility that the temperature of a calculation unit has increased beyond a normal predetermined range is determined on the basis of the load on the calculation unit, and if there is a possibility that the temperature has increased and the temperature measured by a temperature sensor is actually equal to or greater than a predetermined value, the clock frequency is decreased to suppress temperature increase. If the load on the calculation unit is low and there is no possibility of temperature increase, the clock frequency is not decreased. Thus, unnecessary decrease of the clock frequency due to error of the temperature sensor can be avoided. Further, in accordance with change of the clock frequency, a timer value used for processing time monitoring by the calculation unit is changed. Therefore, even if the processing time is prolonged, as long as this is within a permissible range for each clock frequency, erroneous determination that abnormality has occurred can be prevented.

Embodiments

Hereinafter, embodiments of the present invention will be described in detail with reference to the drawings.

<Configuration>

Figure 1:
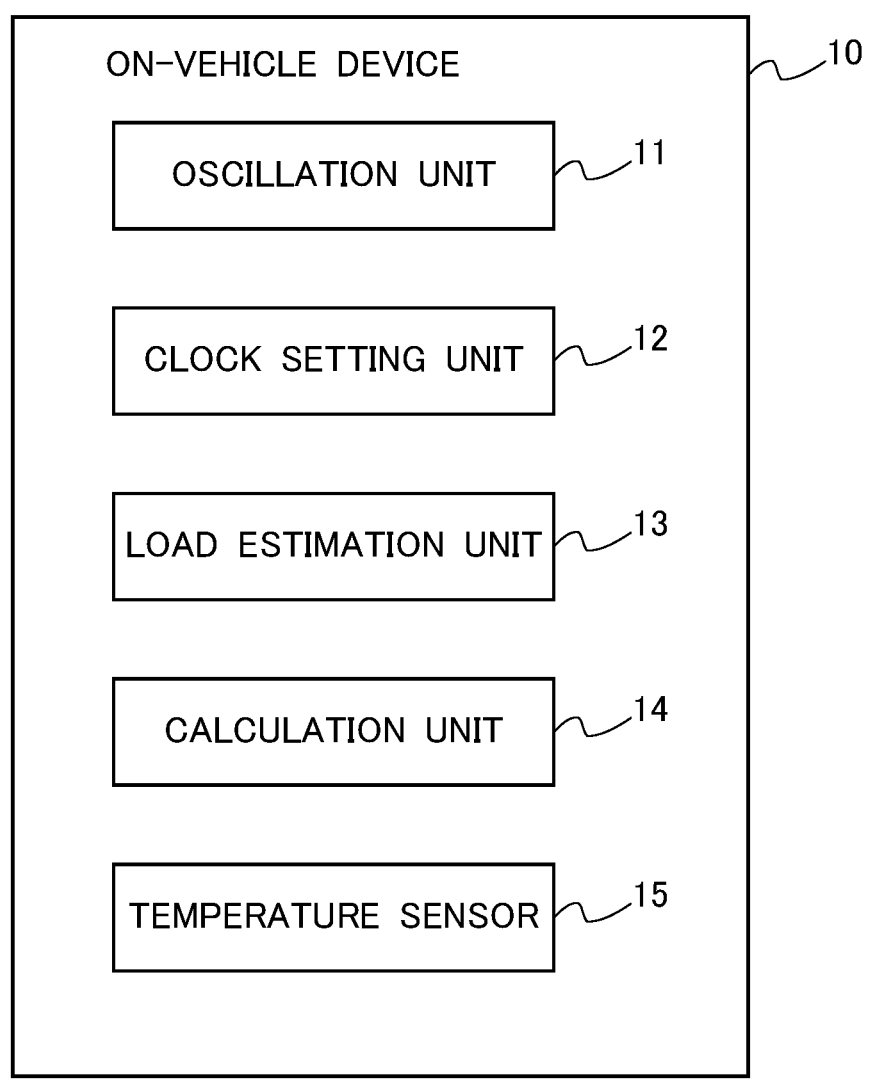
FIG. 1 is a function block diagram of an on-vehicle device according to one embodiment of the present invention.

FIG. 1 shows a function block diagram of an on-vehicle device 10 according to the present embodiment. The on-vehicle device 10 includes an oscillation unit 11, a clock setting unit 12, a load estimation unit 13, a calculation unit 14, and a temperature sensor 15. The on-vehicle device 10 is provided to a vehicle and is an electronic control unit (ECU) for controlling an engine, a steering, a brake, and the like on the basis of information indicating the condition around a vehicle acquired from a camera, a radar, or the like. The oscillation unit 11 generates and outputs a clock signal. The calculation unit 14 is configured from one processor or two or more processors such as a central processor unit (CPU) and a graphics processing unit (GPU), and operates on the basis of the clock signal. The load estimation unit 13 estimates the load on the calculation unit 14 by a method described later, and on the basis of a result of the estimation, estimates a possibility of temperature increase in the calculation unit 14. The temperature sensor 15 is typically provided near the calculation unit 14 and measures the temperature of the calculation unit 14. However, the temperature sensor 15 may be provided at any position as long as the measured value thereof has a certain correlation with the temperature of the calculation unit 14. The clock setting unit 12 acquires a result of the estimation for the possibility of temperature increase in the calculation unit 14 by the load estimation unit 13, and a temperature measured by the temperature sensor 15, and on the basis of these, changes a clock frequency which is the frequency of the clock signal outputted from the oscillation unit 11. It is noted that the functions of the clock setting unit 12 and the load estimation unit 13 may be provided in the processor of the calculation unit 14.

<Process>

Figure 2:
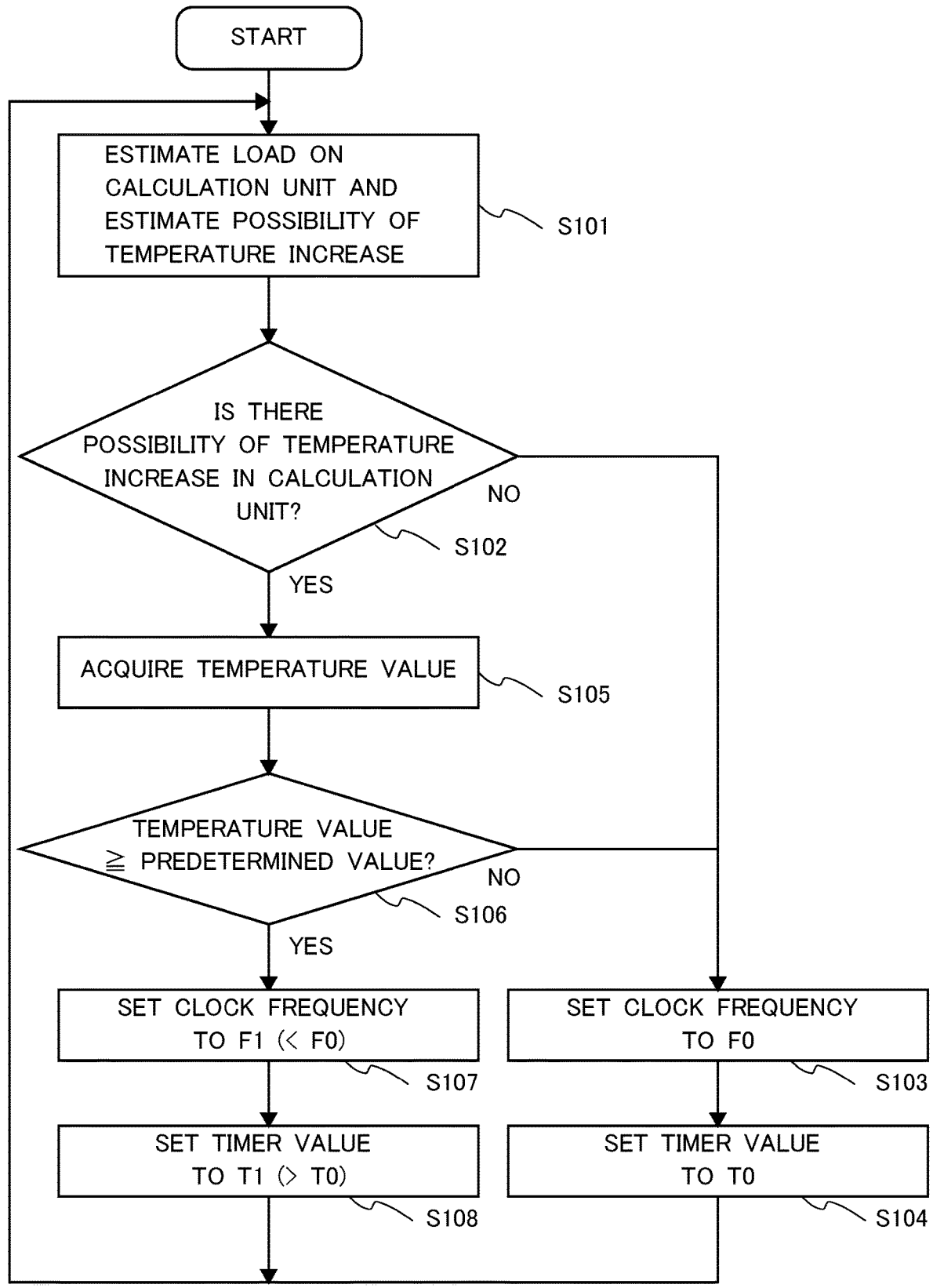
FIG. 2 is a flowchart showing a clock frequency change process in the on-vehicle device according to one embodiment of the present invention.

An example of a clock frequency change process according to the present embodiment will be described. FIG. 2 is a flowchart showing the clock frequency change process performed by the on-vehicle device 10. This process is started when the on-vehicle device 10 is activated, for example. At the time of starting, the clock frequency is set at a normal value F0, and a timer value described later is set at a normal value T0.

(Step S101): The load estimation unit 13 estimates the load on the calculation unit 14. The load estimation unit 13 can estimate the load on the calculation unit 14 appropriately on the basis of the usage rate of the calculation unit 14, the vehicle traveling circumstance, or the like. The traveling circumstance is, for example, the number of objects such as other vehicles and persons in front of the vehicle. The calculation unit 14 performs processing for detecting the position, the distance, the direction, the motion, and the like of an object or avoiding the object, on the basis of the above information indicating the condition around the vehicle. In the traveling circumstance in which a large number of processing targets, such as objects, for the calculation unit 14 are present, the load on the calculation unit 14 increases. Therefore, if the present usage rate of the calculation unit 14 or the number of objects exceeds a predetermined value, the load estimation unit 13 can estimate that the calculation unit 14 is in a high load state and there is a possibility that the temperature of the calculation unit 14 has increased beyond a normal predetermined range. In addition, if the usage rate of the calculation unit 14 or the number of objects has exceeded for a predetermined period until the present since a predetermined time ago, the calculation unit 14 can estimate that there is a possibility that the temperature of the calculation unit 14 still has increased beyond a predetermined range at present.

(Step S102): If the load estimation unit 13 estimates that there is a possibility of temperature increase in the calculation unit 14, the process proceeds to step S105, and on the other hand, if the load estimation unit 13 estimates that there is no possibility of temperature increase in the calculation unit 14, the process proceeds to step S103.

(Step S103): The clock setting unit 12 sets the clock frequency to the normal value F0. If the clock frequency has already been set at the normal value F0, the setting thereof is maintained.

(Step S104): The clock setting unit 12 sets the timer value to the normal value T0. If the timer value has already been set at the normal value T0, the setting thereof is maintained. After this step is executed, the process returns to step S101 to repeat execution of this flow.

(Step S105): The clock setting unit 12 acquires a temperature value measured by the temperature sensor 15.

(Step S106): If the acquired temperature value is equal to or greater than a predetermined value, the clock setting unit 12 proceeds to step S107, and on the other hand, if the acquired temperature value is smaller than the predetermined value, the clock setting unit 12 proceeds to step S103. It is noted that the predetermined value is a temperature value equal to or smaller than an upper limit temperature value at which operation of the calculation unit 14 is permissible.

(Step S107): The clock setting unit 12 sets the clock frequency to a value F1 for high temperature, which is decreased from the normal value F0.

(Step S108): The clock setting unit 12 sets the timer value for processing time monitoring performed by the calculation unit 14, to a value T1 which is greater than the normal value T0.

Figure 3:
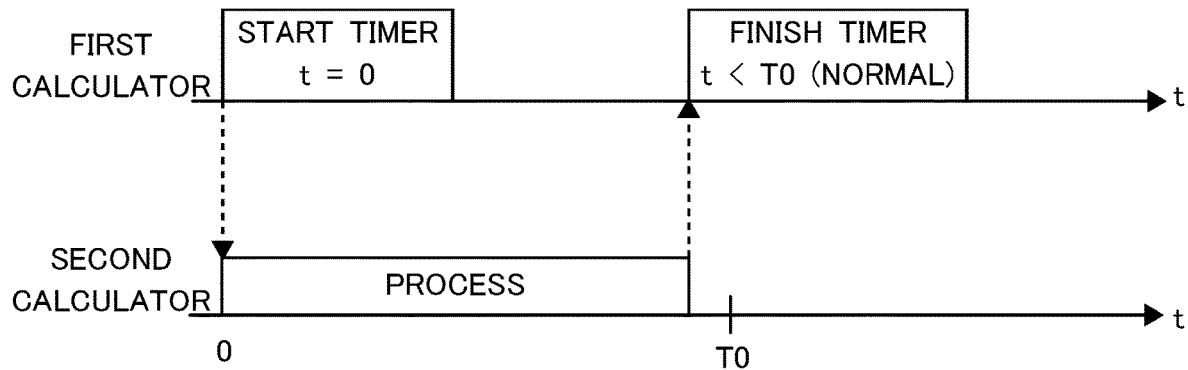
FIG. 3 is a time chart showing an execution example of a processing time monitoring process in the on-vehicle device according to one embodiment of the present invention.
Figure 4:
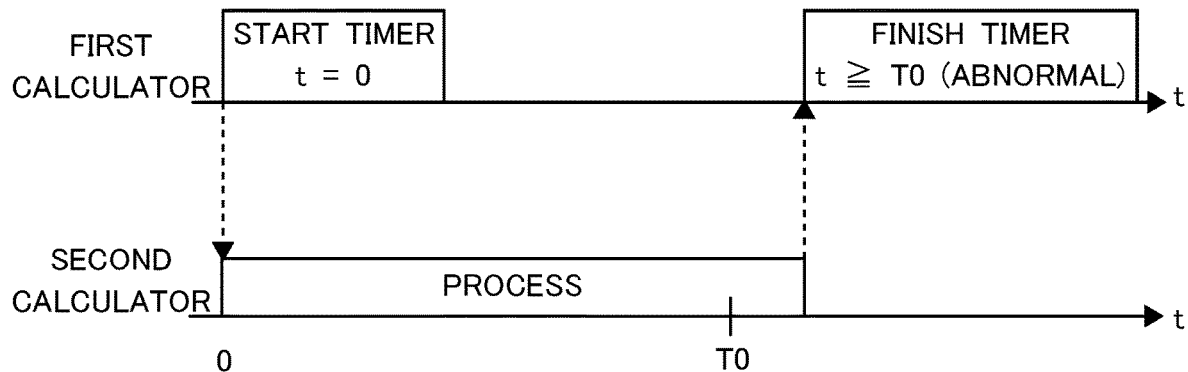
FIG. 4 is a time chart showing a comparison example of the processing time monitoring process in the on-vehicle device according to one embodiment of the present invention.
Figure 5:
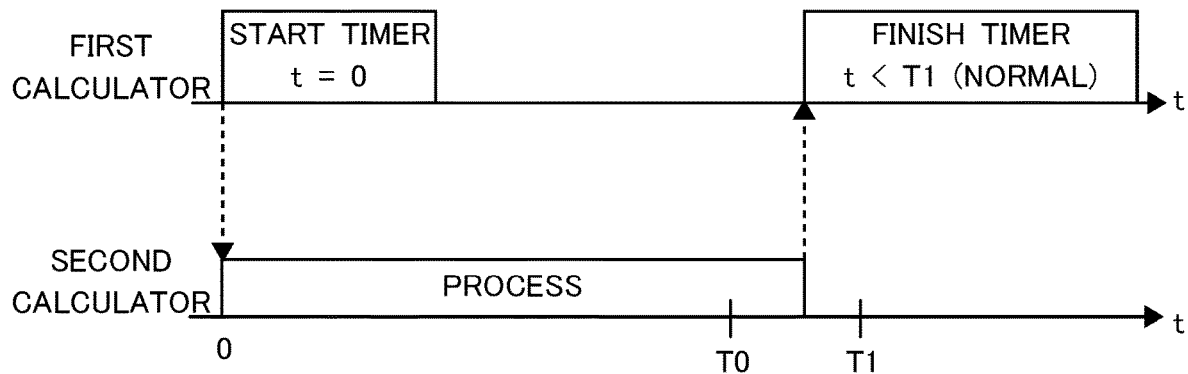
FIG. 5 is a time chart showing an execution example of the processing time monitoring process in the on-vehicle device according to one embodiment of the present invention.

Here, the timer value will be described. FIGS. 3, 4, and 5 are time charts illustrating a process for processing time monitoring, performed by the calculation unit 14. Here, as an example, the calculation unit 14 is composed of a first calculator and a second calculator, and the first calculator monitors a processing time of the second calculator. In the examples shown in FIGS. 3, 4, and 5, when the second calculator starts a predetermined process, the first calculator starts counting by a timer, and when the second calculator finishes the predetermined process, the first calculator finishes the counting by the timer.

In the example shown in FIG. 3, the clock frequency is F0 which is the normal value, and a count value t when the process is finished is smaller than T0 which is the normal value of the timer value. In this case, the first calculator determines that the processing time is normal and the second calculator is operating normally. In this way, if the count value of the timer for the processing time of the second calculator is smaller than an appropriately set timer value, the first calculator determines that the second calculator is operating normally, and otherwise, the first calculator determines that abnormality has occurred in the second calculator, to execute a predetermined process for abnormal case, for example.

The example in FIG. 4 shows an inconvenience in the case where, when the clock frequency is the value F1 decreased from F0, the timer value is set at the normal value T0. In this case, since the clock frequency is decreased, the processing time is prolonged even if the second calculator is operating normally. Therefore, if it is detected that the count value t when the process is finished is equal to or greater than T0 which is the normal value of the timer value, or that the count value reaches T0 during the process, the first calculator erroneously determines that abnormality has occurred in the second calculator even if the second calculator is operating normally.

In the example shown in FIG. 5, as in this step, the timer value is set to the value T1 which is greater than the normal value T0, in accordance with increase in the processing time, when the clock frequency is the decreased value F1. In this case, if the count value t when the process is finished is smaller than the timer value T1, it is determined that the second calculator is operating normally, and otherwise, it is determined that abnormality has occurred in the second calculator. Thus, appropriate determination can be performed. It is noted that, since the processing time is in inverse proportion to the clock frequency, the timer value T1 can be set so as to satisfy the following Expression 1, using the normal value T0 of the timer value, the normal value F0 of the clock frequency, and the value F1 decreased from F0.

$T1 = T0 \times F0/F1$ (Expression 1)

After this step is executed, the process returns to step S101 to repeat execution of this flow.

Effects

As described above, in the case where, since, for example, the calculation unit 14 is in a high load state at present or during the last predetermined period, there is a possibility that the temperature thereof has increased beyond the normal predetermined range, and the temperature value measured by the temperature sensor is actually equal to or greater than the predetermined value, the clock setting unit 12 decreases the clock frequency to suppress temperature increase. Therefore, if there is no possibility that the temperature of the calculation unit 14 has increased beyond the normal predetermined range, the clock frequency is not decreased even if a temperature equal to or greater than a predetermined value is detected due to error of the temperature sensor 15. Thus, unnecessary decrease of the clock frequency can be avoided. In addition, in accordance with change of the clock frequency, the clock setting unit 12 changes the timer value to be used for the processing time monitoring by the calculation unit 14. Therefore, even if the processing time is prolonged, as long as this is within a permissible range for each clock frequency, erroneous determination that abnormality has occurred can be prevented.

It is noted that, in the case where the calculation unit 14 does not perform monitoring of the processing time, setting and changing of the timer value are unnecessary and thus the above processing in step S104 and S108 does not need to be performed. In addition, the processing in step S101 and S102 and the processing in step S105 and S106 may be replaced with each other. That is, if the temperature value of the temperature sensor 15 is smaller than a predetermined value, the process may proceed to step S103 and estimation for a possibility of temperature increase based on the load on the calculation unit 14 may not be performed. In addition, during a period in which the clock frequency is decreased, the calculation unit 14 may stop or omit some processes that have low priorities, or such a process may be replaced with a simple alternative process having a smaller calculation amount.

Modifications

In the above embodiment, in step S107, the decreased value of the clock frequency is the fixed value F1, and in step S108, the timer value is the fixed value T1. However, the decreased value of the clock frequency and the timer value corresponding to the decreased value may be each calculated so as to have a plurality of values on the basis of at least one of the load on the calculation unit 14 estimated by the load estimation unit 13 and the temperature value measured by the temperature sensor 15. For example, the clock setting unit may calculate the clock frequency by subtracting, from the present set value, a value determined on the basis of at least one of the load on the calculation unit 14 estimated by the load estimation unit 13 and the temperature value measured by the temperature sensor 15. Such calculation may be performed on the basis of a predetermined mathematical formula or may be performed by referring to a predetermined table. Thus, it is possible to perform control according to the degree of the load on the calculation unit 14. For example, control may be performed such that, as the load increases beyond a predetermined level, the clock frequency decreases in a stepwise manner, and as the load decreases, the clock frequency increases in a stepwise manner, whereby it is possible to perform appropriate control in which suppression of temperature increase in the calculation unit 14 and suppression of reduction in the processing capability are balanced. In step S101, the load estimation unit 13 may acquire the temperature outside the vehicle as the traveling circumstance, and if the outside temperature is higher than a predetermined value, the load estimation unit 13 may estimate that there is a high possibility of temperature increase in the calculation unit 14, even if the load on the calculation unit 14 is not high.

The present invention may be implemented as not only an on-vehicle device but also a clock setting method executed by the calculation unit of the on-vehicle device, such a program, a computer-readable non-transitory storage medium having such a program stored therein, and the like.

The present invention is useful for electric devices provided to a vehicle or the like.

What is claimed is:

1. An on-vehicle device comprising:
    an oscillation unit configured to output a clock signal;
    at least one calculation unit configured to operate on the basis of the clock signal;
    a temperature sensor configured to sense a temperature of the at least one calculation unit;
    an estimation unit configured to estimate a load on the at least one calculation unit,
    a determination unit configured to, on the basis of the estimated load, determine whether there is a possibility of temperature increases in the at least one calculation unit; and
    a setting unit configured to set a frequency of the clock signal to be outputted from the oscillation unit, wherein
    the setting unit decreases the frequency of the clock signal, if the determination unit determines that there is a possibility of temperature increases in the at least one calculation unit, and the temperature sensed by the temperature sensor is equal to or greater than a predetermined temperature.

2. The on-vehicle device according to claim 1, wherein
    the at least one calculation unit has a function of determining that abnormality has occurred if a time required for predetermined processing is equal to or longer than a predetermined time, and
    the setting unit sets the predetermined time so that the predetermined time increases in accordance with an amount by which the frequency of the clock signal is decreased.

3. The on-vehicle device according to claim 1, wherein
    the setting unit decreases the frequency of the clock signal by subtracting, from a clock frequency set at present, a value determined on the basis of at least one of the load estimated by the estimation unit and a temperature value outputted from the temperature sensor.

4. The on-vehicle device according claim 1, wherein
    the determination unit determines that there is a possibility of temperature increases in the at least one calculation unit, if at least one of a condition that a usage rate of the at least one calculation unit is equal to or greater than a predetermined value and a condition that a vehicle is in a predetermined traveling circumstance is satisfied at present or has been satisfied for a last predetermined period.

5. The on-vehicle device according to claim 4, wherein
    the condition that the vehicle is in the predetermined traveling circumstance is that a number of processing targets of the at least one calculation unit is equal to or greater than a predetermined number.

6. A clock setting method to be executed by at least one calculation unit of an on-vehicle device, the on-vehicle device including an oscillation unit configured to output a clock signal, the at least one calculation unit configured to operate on the basis of the clock signal, and a temperature sensor configured to sense a temperature of the at least one calculation unit, the clock setting method comprising:
    estimating a load on the at least one calculation unit;
    determining, on the basis of the estimated load, whether there is a possibility of temperature increases in the at least one calculation unit;
    acquiring a temperature outputted from the temperature sensor; and
    decreasing a frequency of the clock signal, if the determining determines that there is a possibility of temperature increases in the at least one calculation unit, and the temperature outputted from the temperature sensor is equal to or greater than a predetermined temperature.

7. A computer-readable non-transitory storage medium having stored therein a clock setting program to be executed by at least one calculation unit of an on-vehicle device, the on-vehicle device including an oscillation unit configured to output a clock signal, the at least one calculation unit configured to operate on the basis of the clock signal, and a temperature sensor configured to sense a temperature of the at least one calculation unit, the clock setting program comprising:
    estimating a load on the at least one calculation unit;
    determining, on the basis of the estimated load, whether there is a possibility of temperature increases in the at least one calculation unit;
    acquiring a temperature outputted from the temperature sensor; and
    decreasing a frequency of the clock signal, if the determining determines that there is a possibility of temperature increases in the at least one calculation unit, and the temperature outputted from the temperature sensor is equal to or greater than a predetermined temperature.

8. The on-vehicle device according to claim 2, wherein
    the determination unit determines that there is a possibility of temperature increases in the at least one calculation unit, if at least one of a condition that a usage rate of the at least one calculation unit is equal to or greater than a predetermined value and a condition that a vehicle is in a predetermined traveling circumstance is satisfied at present or has been satisfied for a last predetermined period.

9. The on-vehicle device according to claim 3, wherein the determination unit determines that there is a possibility of temperature increases in the at least one calculation unit, if at least one of a condition that a usage rate of the at least one calculation unit is equal to or greater than a predetermined value and a condition that a vehicle is in a predetermined traveling circumstance is satisfied at present or has been satisfied for a last predetermined period.

* * * * *